United States Patent [19]
Iwane

[11] Patent Number: 5,265,105
[45] Date of Patent: Nov. 23, 1993

[54] DECODING CIRCUIT FOR INHIBITING ERROR PROPAGATION

[75] Inventor: Yasushi Iwane, Hyogo, Japan

[73] Assignee: Mitsubishi Denki Kabushiki Kaisha, Tokyo, Japan

[21] Appl. No.: 590,190

[22] Filed: Sep. 28, 1990

[30] Foreign Application Priority Data

Apr. 6, 1990 [JP] Japan ................................ 2-92638

[51] Int. Cl.⁵ .............................................. G06F 11/10
[52] U.S. Cl. ..................................... 371/43; 371/37.7; 371/42; 371/67.1
[58] Field of Search ...................... 371/37.1, 30, 37.6, 371/37.7, 38.1, 43, 53, 42, 65

[56] References Cited

U.S. PATENT DOCUMENTS 4,530,094  7/1985  Sewerinson ......................... 371/43
5,130,993  7/1992  Gutman et al. .................... 371/37.1

FOREIGN PATENT DOCUMENTS 448045      3/1991   European Pat. Off. .
61-173539   8/1986   Japan .
2226206    12/1988   United Kingdom .

OTHER PUBLICATIONS

Patent Abstracts of Japan, vol. 14, No. 85 (E-08990) Feb. 16, 1990, & JP-A-01 296840 (Fujitsu) Nov. 30, 1989.
Patent Abstracts of Japan, vol. 11, No. 374 (E-562) Dec. 5, 1987, & JP-A-62 141875 (Fujitsu) Jun. 25, 1987.
Patent Abstracts of Japan, vol. 12, No. 174 (E-612) (3021) May 24, 1988, & JP-A-62 281531 (NEC) Dec. 7, 1987.
Patent Abstracts of Japan, vol. 8, No. 185 (E-262) Aug. 24, 1984, & JP-A-59 075741 (Akai) Apr. 28, 1984.
Patent Abstracts of Japan, vol. 11, No. 051 (E-480) Feb. 17, 1987, & JP-1-61 214630 (Canon) Sep. 24, 1986.

Primary Examiner—Vincent P. Canney
Attorney, Agent, or Firm—Rothwell, Figg, Ernst & Kurz

[57] ABSTRACT

A decoding circuit receives signals encoded in differential logical conversion, and decodes the received signals into original signals. During the decoding, a predetermined data bit position included in the original signals is detected in the received signal, and also the predetermined data is forcedly set to the bit position of the decoded signal, thereby bit error propagation is suppressed up to the position of the known data.

10 Claims, 9 Drawing Sheets

FIG. 2
(PRIOR ART)

| i  | 0 | 1 | 2 | 3 | 4 | 5 | 6 | 7 | 8 | 9 | 10 | 11 | 12 | 13 | 14 | 15 | 16 | 17 | 18 | 19 | 20 |
|----|---|---|---|---|---|---|---|---|---|---|----|----|----|----|----|----|----|----|----|----|----|
| ai | 0 | 0 | 0 | 0 | 1 | 0 | 0 | 1 | 1 | 0 | 1  | 1  | 0  | 0  | 1  | 0  | 0  | 1  | 0  | 1  | 0  |
| bi | 0 | 1 | 1 | 1 | 1 | 1 | 1 | 0 | 0 | 1 | 1  | 1  | 0  | 0  | 1  | 1  | 0  | 1  | 1  | 1  | 1  |
| ci | 0 | 1 | 1 | 1 | 0 | 1 | 1 | 1 | 0 | 0 | 1  | 0  | 0  | 0  | 1  | 1  | 0  | 0  | 1  | 1  | 1  |
| di | 0 | 1 | 0 | 0 | 1 | 0 | 1 | 0 | 1 | 0 | 1  | 1  | 1  | 1  | 0  | 1  | 1  | 1  | 0  | 1  | 0  |

FIG. 4 (a) ci
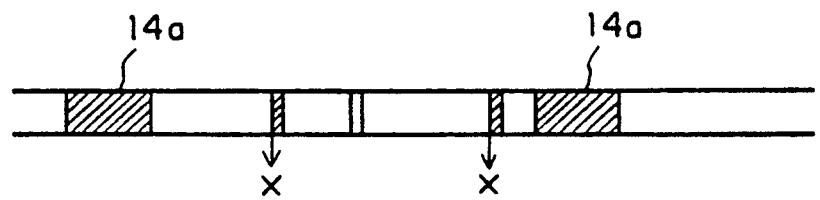
FIG. 4 (b) di
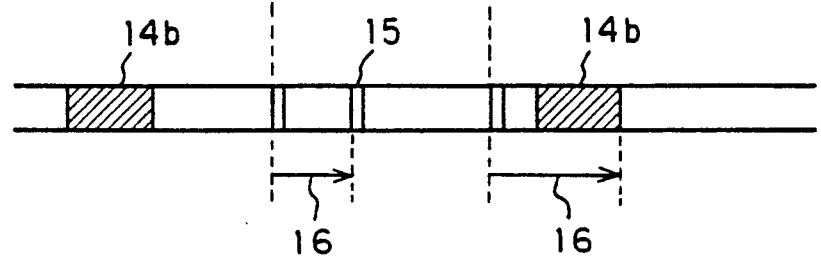
FIG. 4 (c) f
FIG. 4 (d) g
FIG. 11
| FRAME SYNCHRONOUS f | KNOWN DATA TIMING g | DECODING DATA e1 | OUTPUT |
|---|---|---|---|
| L | L | H | H |
| L | L | L | L |
| H | L | X | H |
| L | H | X | L |

DECODING CIRCUIT FOR INHIBITING ERROR PROPAGATION

BACKGROUND OF THE INVENTION

1. Field of the Invention

The present invention relates to a decoding circuit where codes created by differential encoding are decoded.

2. Description of the Prior Art

FIG. 1 is a block diagram showing a decoding circuit where codes created by differential logical conversion are decoded (hereinafter referred to as "sum decoding circuit") together with a differential logical circuit at the transmitting side of a communication system in the prior art. In FIG. 1, numeral 1 designates an input terminal where digital data a are input, numeral 2 designates a one-bit delay circuit constituted by one D-type flip-flop for example, numeral 3 designates an exclusive-OR circuit (hereinafter referred to as "EX-OR") for creating a difference, numeral 4 designates an output terminal where transmitting data b are output, numeral 5 designates a transmission path having noise, numeral 6 designates an input terminal where received data c including error are input, numeral 7 designates a one-bit delay circuit, numeral 8 designates an EX-OR for creating a sum, and numeral 9 designates an output terminal where data d after the sum decoding are output.

Next, operation will be described. The differential logical conversion at the transmitting side is expressed by the following formula.

$$b_i = a_i \oplus a_{i-1} \quad (1)$$

Where $a_i$ designates data before the conversion, and $b_i$ designates data after the conversion, and $a_i$ and $b_i$ correspond to a, b respectively in FIG. 1. Subscript 1 represents the i-th data. Also $\oplus$ represents the addition using 2 as modulus (modulo-2 addition). The input data a is input to one of two input terminals of the EX-OR 3, and also input to the one-bit delay circuit 2. Consequently, viewing the input data from a time series, the output signal of the one-bit delay circuit 2 is one-bit previous data $a_{i-1}$. The EX-OR 3 performs modulo-2 addition of the data signal a, i.e., $a_i$ as one input and the output signal $a_{i-1}$ of the one-bit delay circuit 2 as the other input, and obtains the output data signal b, i.e., $b_i$. FIG. 2 shows the relation between $a_i$ and $b_i$, for example.

The decoding on the receiving side is expressed by the following formula.

$$d_i = c_i \oplus d_{i-1} \quad (2)$$

Where $d_i$ designates decoded data, and $c_i$ designates the received data before the decoding. Formula (2) represents that in order to obtain the i-th decoded data, one-bit previously decoded data [(i−1)th data] may be added to the i-th received data using 2 as modulus. So, the decoded data d is input to the one-bit delay circuit 7 and delayed by one bit, and then adding it to the received data c using 2 as modulus is performed in the EX-OR 8 thereby next decoded data d is obtained. This state is shown in $c_i$, $d_i$ in FIG. 2.

In the sum conversion decoding at the receiving side, two problems occur as follows.

One is a problem in the initial value of the decoded data stream. Transforming the formula (2), it follows that $$d_i = c_i \oplus c_{i-1} \oplus c_{i-2} \oplus \cdots \oplus c_2 \oplus c_1 \oplus d_o \quad (3)$$

The decoded data $d_i$ is determined by the received data series $c_1 - c_i$ and the initial value $d_o$ which cannot be determined only by the received data. The initial value $d_o$ is usually specified in the system whereby the problem is solved.

A second problem is in that since the data transmission path 5 includes noise, the received data c includes error, and after decoding this error propagates in the subsequent data through the sum conversion and so-called error propagation occurs. This state is shown in $c_i$, $d_i$ of FIG. 2. In the received data $c_i$, error occurs in $c_{11}$ and $c_{17}$. In the data $d_i$ after the decoding, not only does the error of $c_{11}$ result in the error of one bit in $d_{11}$, but the inversion of data continues subsequently and the error of the decoded data $d_i$ continues until the data is inverted again in the next received error bit $c_{17}$ and returned to the original state. Thus, if a one-bit error occurs in the received data, all of the following decoded data is inverted and results in error until the next one-bit error of the received data occurs.

Since the sum decoding circuit in the prior art is constituted as described above, problems exist in that the error propagation is produced and the error is enlarged significantly in the decoding circuit.

SUMMARY OF THE INVENTION

In view of the above-mentioned problems in the prior art, an object of the present invention is to provide a sum decoding circuit wherein the error propagation due to the sum decoding is stopped at regular intervals, spread of the error is suppressed and the error rate characteristics can be improved.

In order to attain such object, the invention provides data setting means using known data as feedback data at the transmitter and matching the known data with the receiving timing of the known data inserted in the data series at the receiver.

In the decoding circuit according to the invention, known data is inserted in the data series before the transmission difference conversion and the created difference codes are received, and at the receiving timing of the known data, the known correct data is applied as the data after the decoding. Since the correct data is forcedly fed back as the data after the decoding as above described, the error propagation is stopped and the enlargement of the error is inhibited.

BRIEF DESCRIPTION OF THE DRAWINGS

FIG. 2 is an explanation diagram illustrating an example of coding and decoding of differential codes;

FIGS. 4(A) through (d) are timing charts illustrating operation of the decoding circuit shown in FIG. 3;

FIG. 11 is a logic diagram illustrating operation of the logical circuit shown in FIG. 10.

DETAILED DESCRIPTION OF THE PREFERRED EMBODIMENTS

A sum decoding circuit as an embodiment of the invention will now be described referring to the accompanying drawings.

Figure 1:
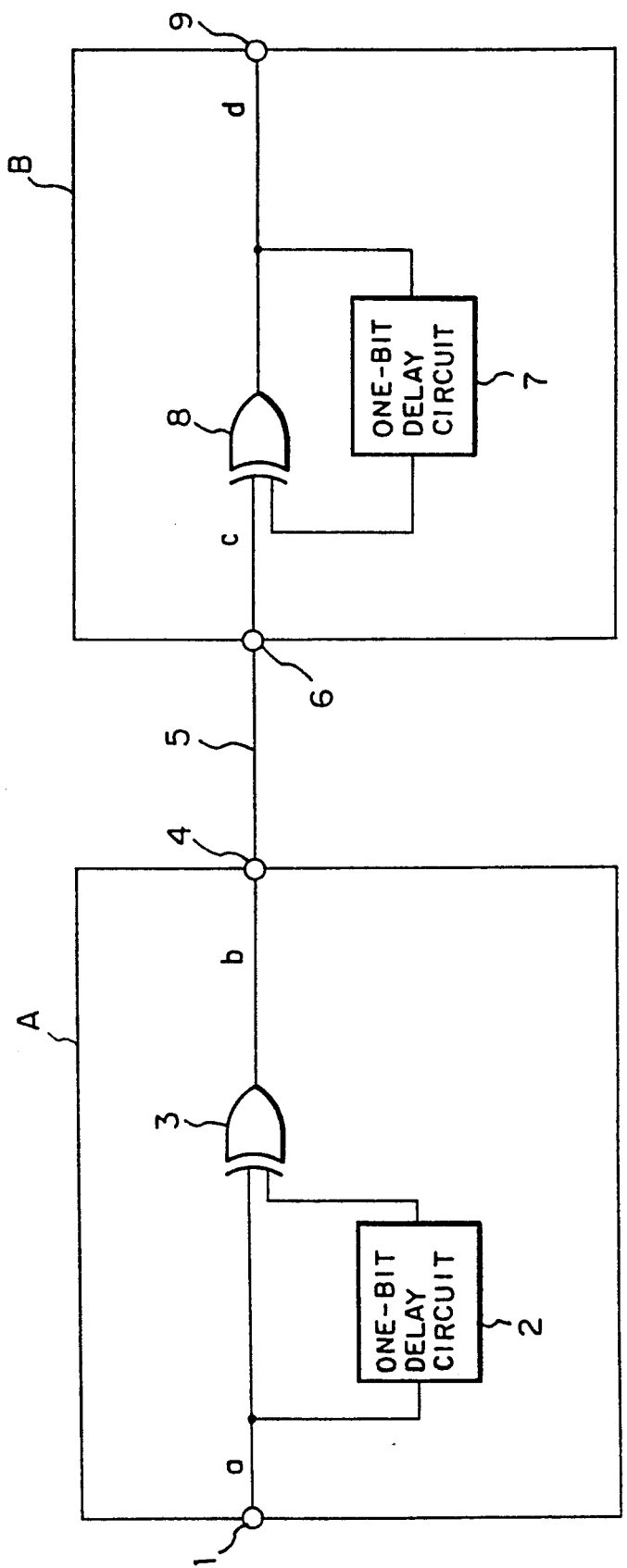
FIG. 1 is a block diagram showing a sum decoding circuit and a differential logical conversion circuit in the prior art.
Figure 3:
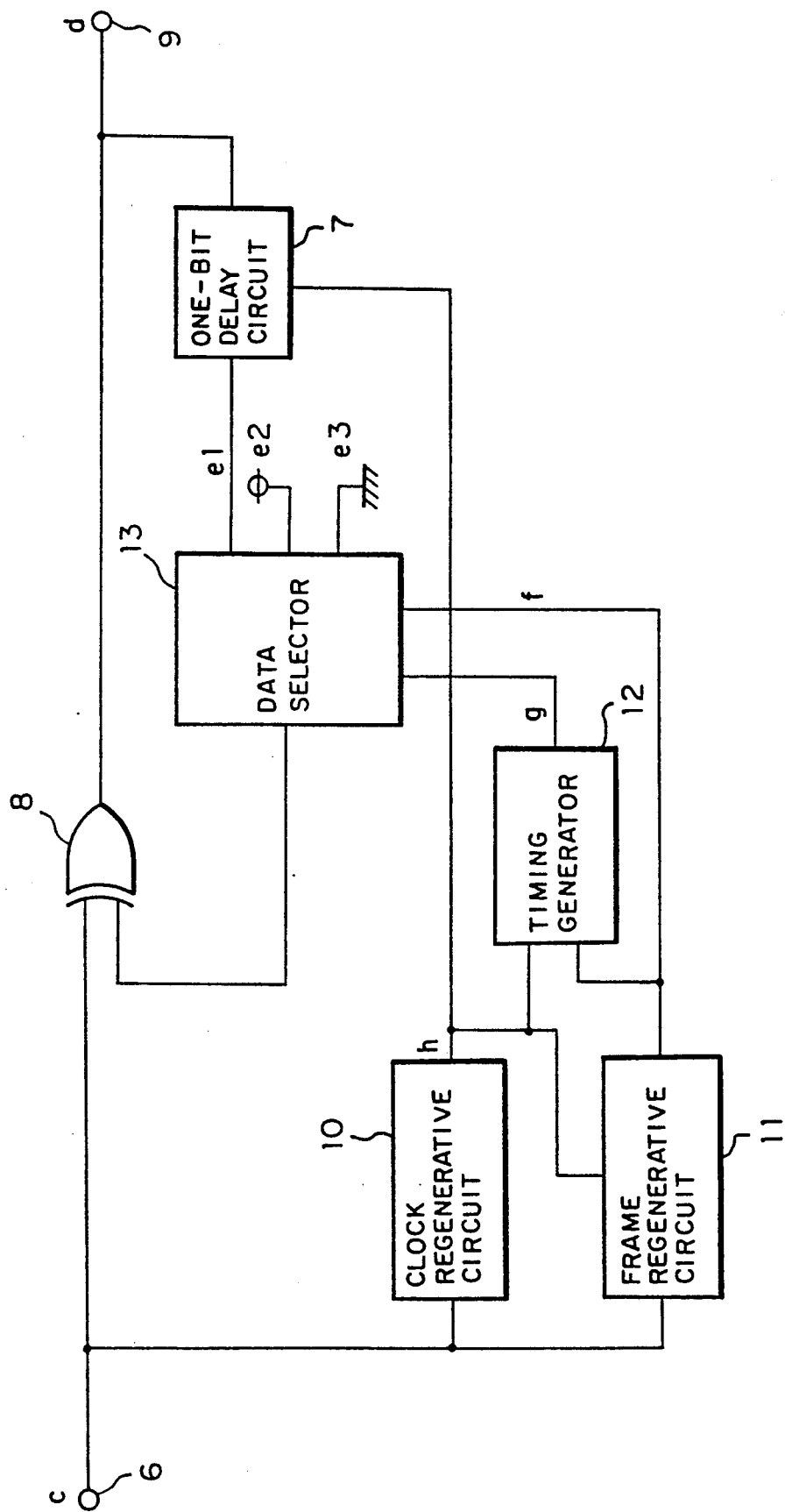
FIG. 3 is a block diagram showing a decoding circuit as a first embodiment of the invention.

FIG. 3 is a block diagram showing a sum decoding circuit as a first embodiment of the invention. In FIG. 3, numeral 6 designates an input terminal where received data c are input, numeral 7 designates a one-bit delay circuit, numeral 8 designates an EX-OR, numeral 9 designates an output terminal where decoded data d after the decoding are output, numeral 10 designates a clock recovery circuit, numeral 11 designates a frame recovery circuit, numeral 12 designates a timing generator used in conjunction with receiving the known data, and numeral 13 designates the a data selector. Also e1 designates output signal of the one-bit delay circuit 7 (being one-bit previously decoded data), e2 designates the initial value of the decoded data stream (The initial value is 1 or "H" level in this case.), and e3 designates the known data (the known data is 0 or "L" level in this case.).

FIG. 4 is a diagram illustrating the state in which the error propagation is stopped by inserting the known data, where $c_i$ in FIG. 4(a) designates the received data, $d_i$ in FIG. 4(b) designates the data after the decoding, numerals 14a, 14b designate the frame synchronization bit series before the decoding and after the decoding respectively, numeral 15 designates the known data series included in the data after the decoding, and numeral 16 designates the error portion of the data $d_i$ after the decoding. Also f in FIG. 4(c) designates the frame synchronization signal, and g in FIG. 4(d) designates the timing signal of receiving the known data.

Next, operation will be described. Signal transmitted by the transmitting side is one obtained by differentially coding the frame synchronization bit series and the effective data. In the effective data, a known data bit is inserted in a prescribed bit position. In the decoding circuit, the clock signal h is regenerated from the input signal c in the clock recovery circuit 10. In this case, the clock recovery circuit 10 is constituted by a PLL (Phrase Locked Loop) for example. Also the frame synchronization signal f is generated from the input signal c and the recovery clock signal h in the frame recovery circuit 11.

Figure 5:
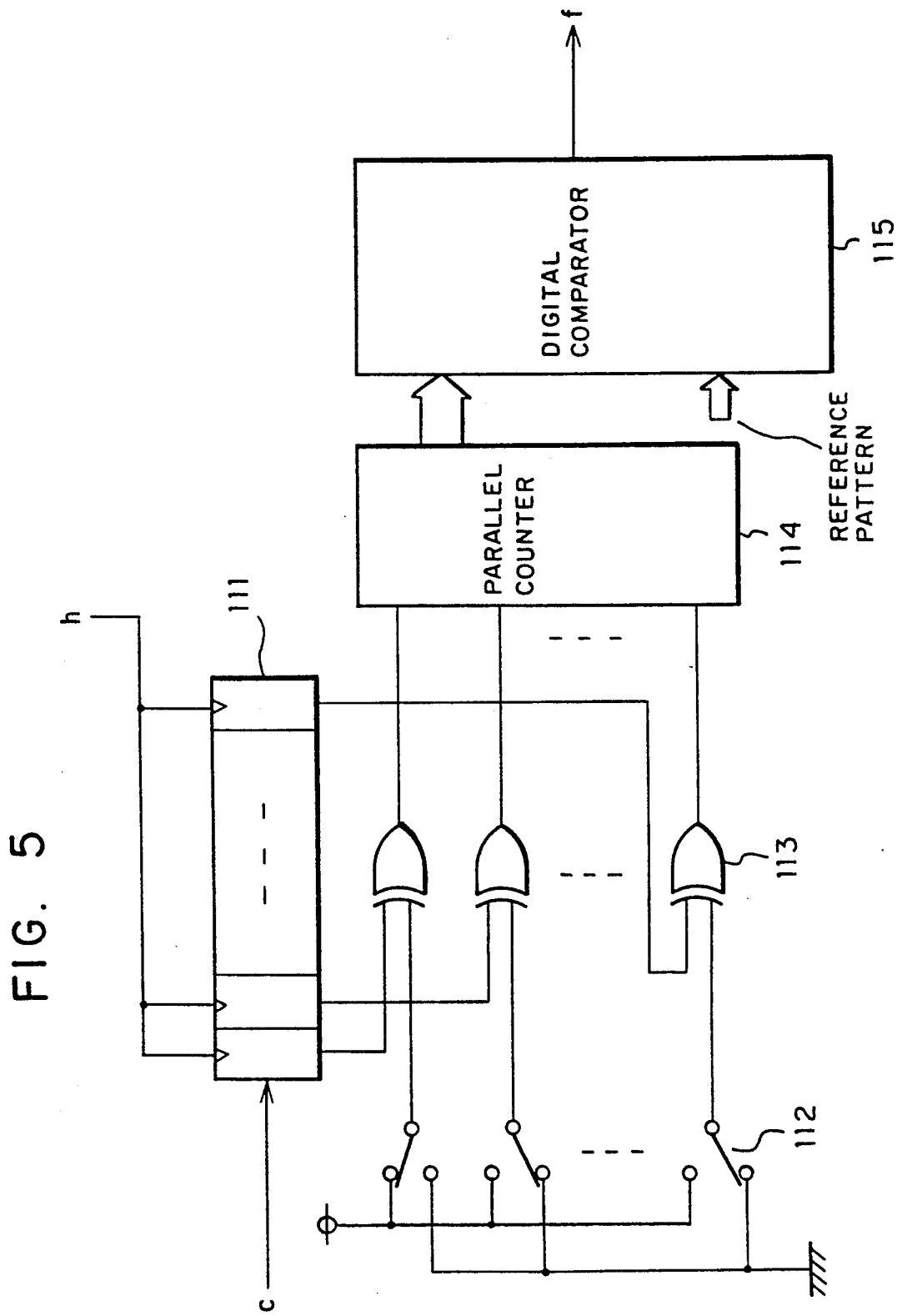
FIG. 5 is a circuit diagram showing a frame recovery circuit.

The frame recovery circuit 11, for example, as shown in FIG. 5, is realized by a digital correlator comprising a shift register 111, a switch group 112, EX-OR 113, a parallel counter 114 and a digital comparator 115. First, the input data c is input to the shift register 111, and is shifted to the right direction one bit by one bit by the recovered clock signal h and stored. The switch group 112 is set to either "H" level or "L" level of each bit corresponding to the known frame synchronization signal before the decoding. The reference pattern by the switch group 112 and the received data are compared in parallel by the EX-OR 113, and a number of coincident data is output from the parallel counter 114 in binary notation. The digital comparator 115 compares the output data of the parallel counter 114 with the threshold data (constant value) previously set, and when the output data value of the parallel counter 114 exceeds the constant threshold value, the frame synchronization signal f is output.

The frame synchronization signal f is input to the data selector 13 and the timing generator 12 for generating the timing of receiving the known data in FIG. 3. Since the position of the known data inserted into the generated data from the transmitting side, for example, a 128th bit of data succeeding the frame synchronization bit series is known, the timing generator 12 can be realized in the constitution shown in FIG. 6 for example.

Figure 6:
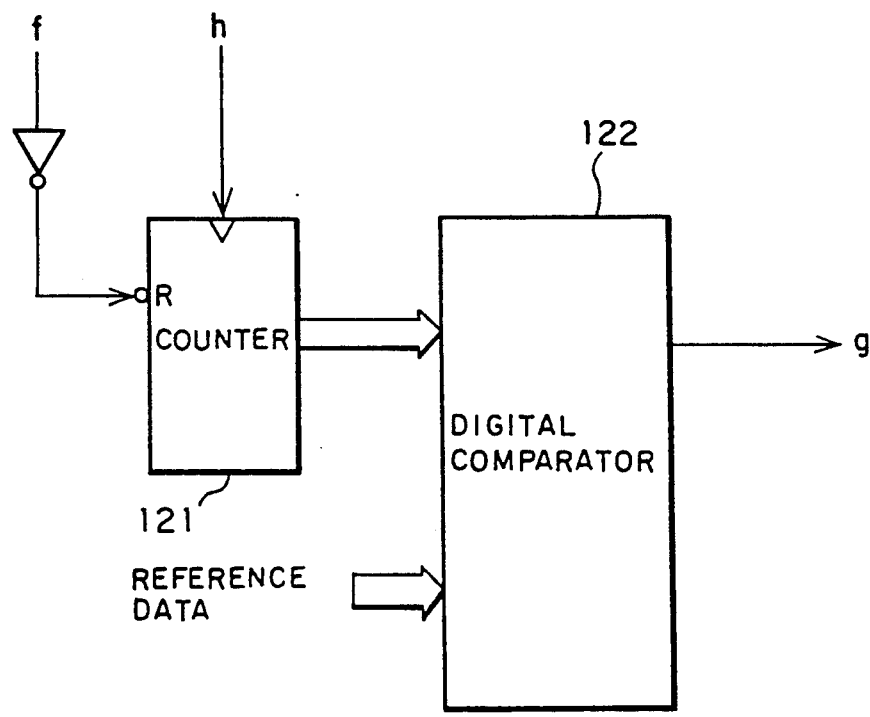
FIG. 6 is a circuit diagram showing a timing generator for generating the receiving timing of the known data.

In FIG. 6, numeral 121 designates a counter, and numeral 122 designates a digital comparator. The counter 121 is reset by the frame synchronization signal f, and advances at each rise of the clock signal h. Consequently, the number of the counter 121 indicates the number of bits from the top end of the data frame. The digital comparator 122 compares the count value with the reference data representing the position of the known data previously set, and when both are coincident, the timing signal g of receiving the known data is output. The timing signal g of receiving the known data is input to the select input of the data selector 13.

FIG. 4 shows the timing of the received data c, the frame synchronization signal f and the timing signal g of receiving the known data. Operation of the data selector 13 will be described referring to FIG. 4. At the usual data receiving state, both the frame synchronization signal f and the timing signal g of receiving the known data are at "L" level. Then the data selector 13 selects e1 among three inputs of data e1, e2, e3, thus the one-bit previously decoded data is input to the EX-OR 8. Consequently, the decoding is performed in similar manner to that in the decoding circuit in the prior art. When the frame synchronization signal f is at "H" (then the timing signal g of receiving the known data is at "L"), the data selector 13 selects the data e2. The data e2 corresponds to the initial value of the decoded data stream, and $d_o$ shown in formula (3) is input to the decoding circuit EX-OR 8 then. When the timing signal g of receiving the known data is at "H" (then the signal h is at "L"), the data selector 13 selects the data e3. The data e3 is data equal to the known data, and is made "L" in the embodiment. Consequently, at the time of receiving the known data, the feedback loop of the decoding circuit is cut, and the correct decoded data is supplied to the decoding circuit irrespectively of whether the one-bit previously decoded data is correct or not. Consequently, the error propagation is stopped at the time of receiving the known data. In FIG. 4, "x" at (a) indicates the occurrence of a data error, and numeral 16 indicates the error portion of the data after the decoding.

Figure 8:
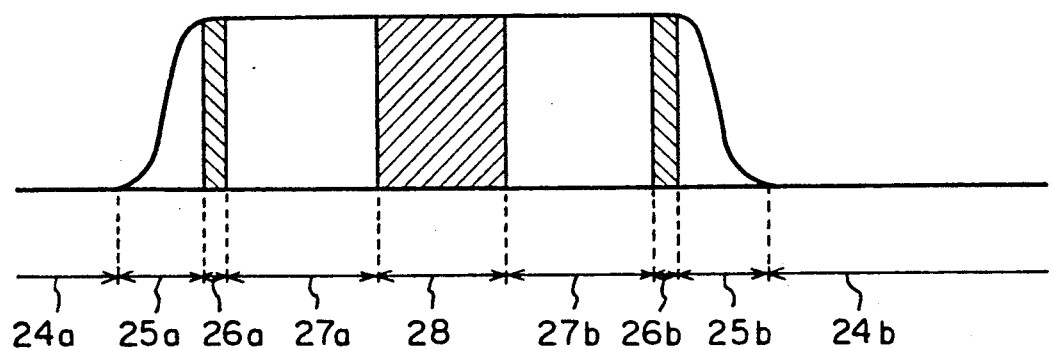
FIG. 8 is a data constitution diagram illustrating constitution of data having mid-amble.
Figure 7:
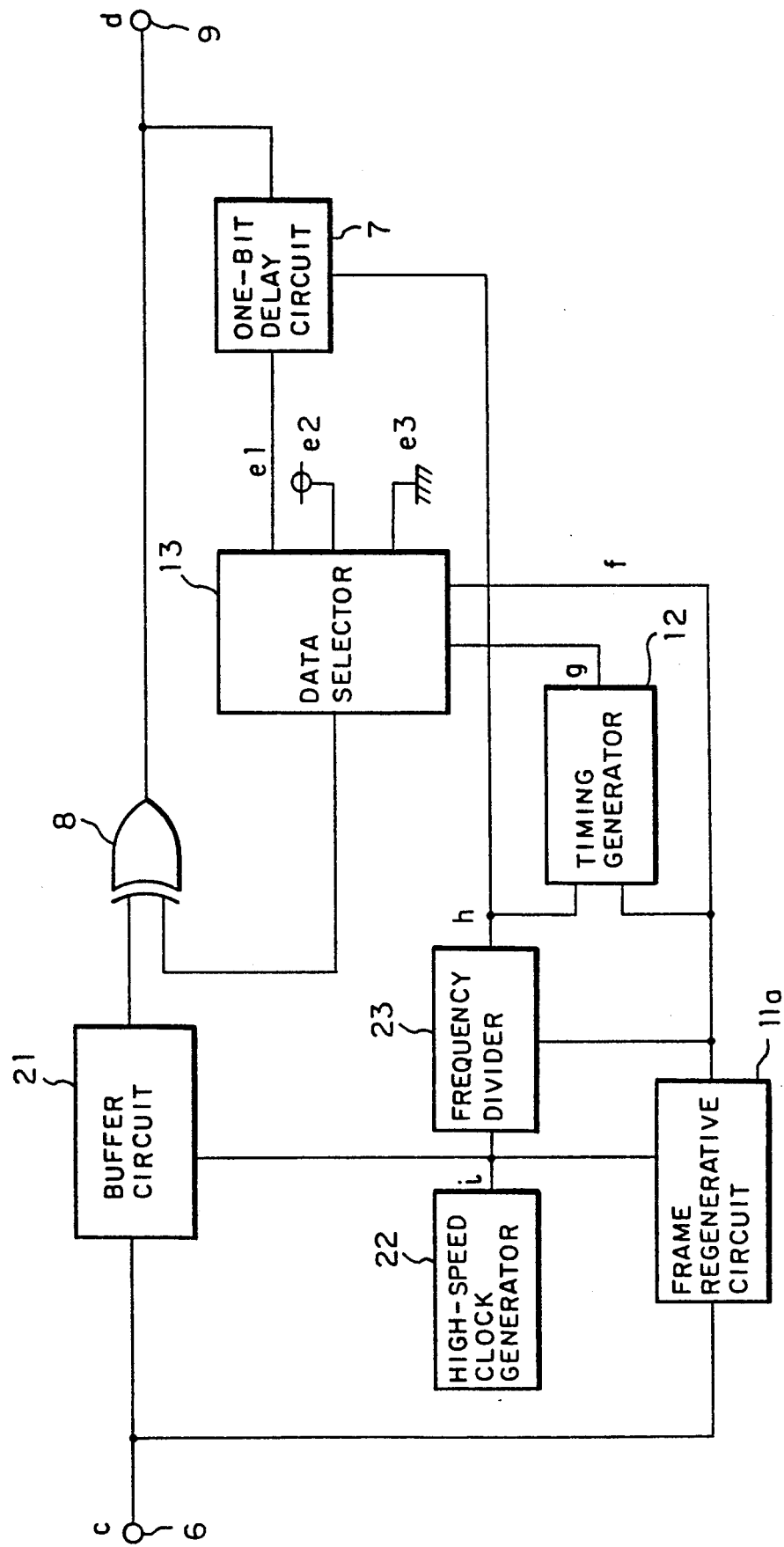
FIG. 7 is a block diagram showing a decoding circuit as a second embodiment of the invention.

FIG. 7 is a block diagram showing a decoding circuit as a second embodiment of the invention. The decoding circuit is constituted so that data generated by the transmitting side has the known data series including frame synchronization bits (hereinafter referred to as "mid-amble") at the center portion as shown in FIG. 8.

In FIG. 7, numeral 11a designates a frame recovery circuit, numeral 12 designates a timing generator for timing reception of the known data, numeral 13 designates a data selector, numeral 21 designates a data buffer circuit, numeral 22 designates a high-speed clock generator for generating the high speed clock i, and numeral 23 designates a frequency divider. Also in FIG. 8, numerals 24a, 24b designate non-transmitting portions, numeral 25a designates rising portion of the transmitting power, numeral 25b designates falling portion of the transmitting power, numerals 26a, 26b designate tail bits, numerals 27a, 27b designate data carrying the information, and numeral 28 designates a mid-amble frame section.

Operation of the second embodiment will be described. As shown in FIG. 8, the mid-amble 28 for the frame synchronization is arranged at the center portion of the received signal. The received signal c is sampled with the high speed clock i, and stored in the buffer circuit 21 temporarily. In this case, the buffer circuit 21 is realized by a shift register, for example. The frame recovery circuit 11a of FIG. 7 is driven by the clock in at a higher speed than the bit rate, and detects the mid-amble from the received signal c. That is, the frame recovery circuit 11a may be constituted in similar manner to the frame recovery circuit 11 shown in FIG. 5, but the number of steps of the shift register is $$\text{number of bits of mid-amble} \times \frac{\text{frequency of high speed clock}}{\text{bit rate}}$$

Also the number of switches in the switch group 112 is equal to the number of steps of the shift register in this case.

Also the recovery clock signal h is created as follows. First, the frequency divider 23 is reset by the frame synchronization signal f. Consequently, the phase of the recovery clock signal h is coincident to the phase of received signal c with reference to the frame synchronization signal f. And then the frequency divider 23 performs the frequency dividing of the high speed clock signal at the frequency dividing ratio of $$\frac{\text{frequency of high speed clock}}{\text{bit rate}}$$

If the number of steps of the buffer circuit 21 being the shift register is set so that the data received before the frame synchronization signal is stored in the buffer circuit 21, the first bit of the received signal c is input to the EX-OR 8 when the frame synchronization signal f is output, thereby the subsequent operation can be explained in similar manner to the first embodiment. However, the tail bit is used as the initial data, and any one bit among the mid-amble 28 is used as the inserted known data.

Figure 9:
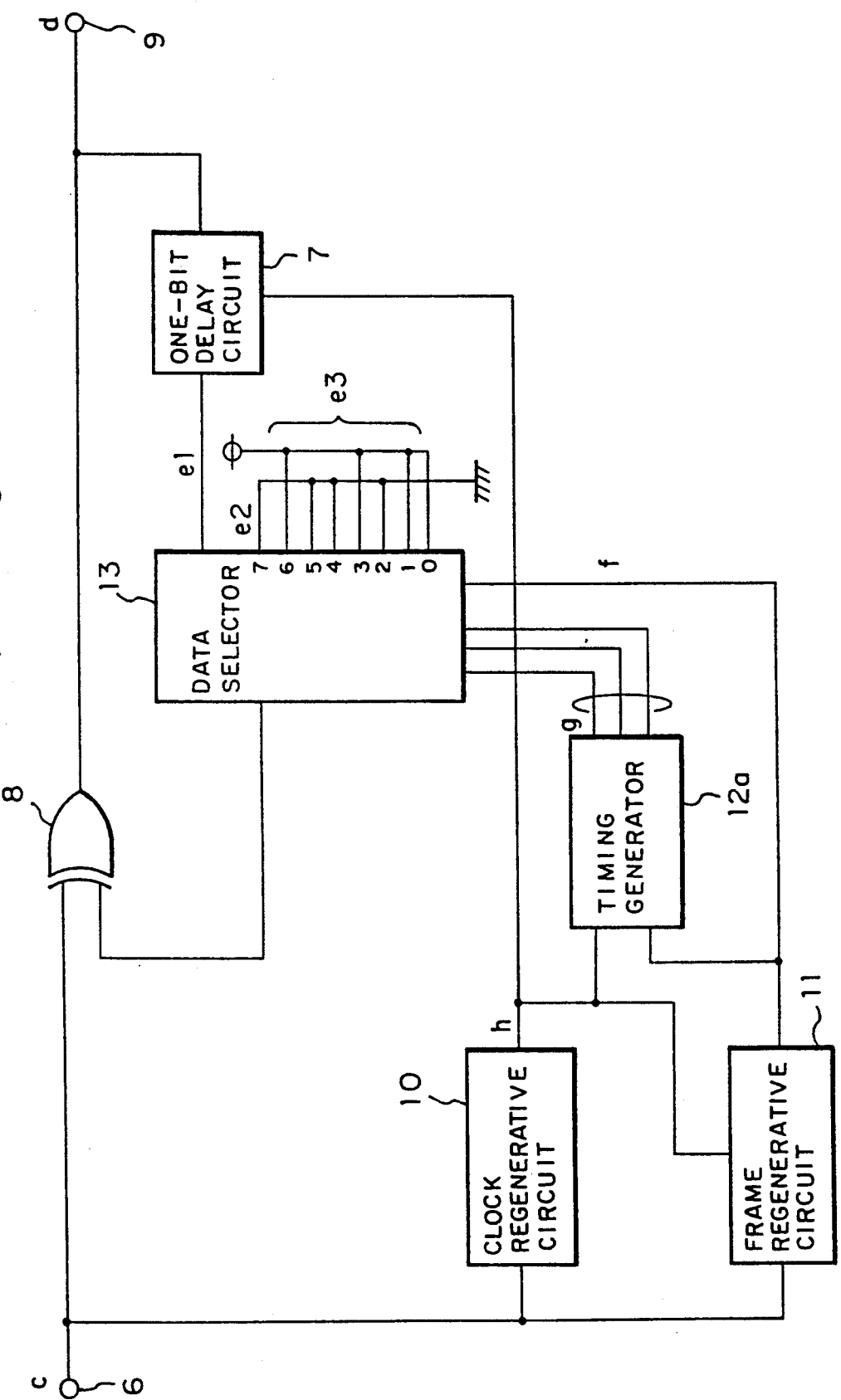
FIG. 9 is a block diagram showing a decoding circuit as a third embodiment of the invention.

In the embodiment shown in FIG. 3, the known data after the frame synchronization signal f appears at one position, but it may appear at plural positions. An embodiment in this case is shown in FIG. 9. The decoding circuit shown in FIG. 9 can be used when the known data to be utilized for stopping the error propagation exists at seven positions at most. In this case, the output signal lines of the timing generator 12a are enlarged to three lines, and prescribed pattern is output at respective timings of the known data existing at seven positions at most. Corresponding to this pattern, the data selector 13 selects either one among seven data previously set as the known data and the initial value or the ordinarily decoded data.

The timing generator 12a may be constituted in similar manner to that shown in FIG. 6, but the digital comparator 122 is constituted to enable comparison of the comparing data of seven values at most with the output of the counter 121, and when each comparing data and the output of the counter 121 are coincident, pattern corresponding to each comparing data is output.

Figure 10:
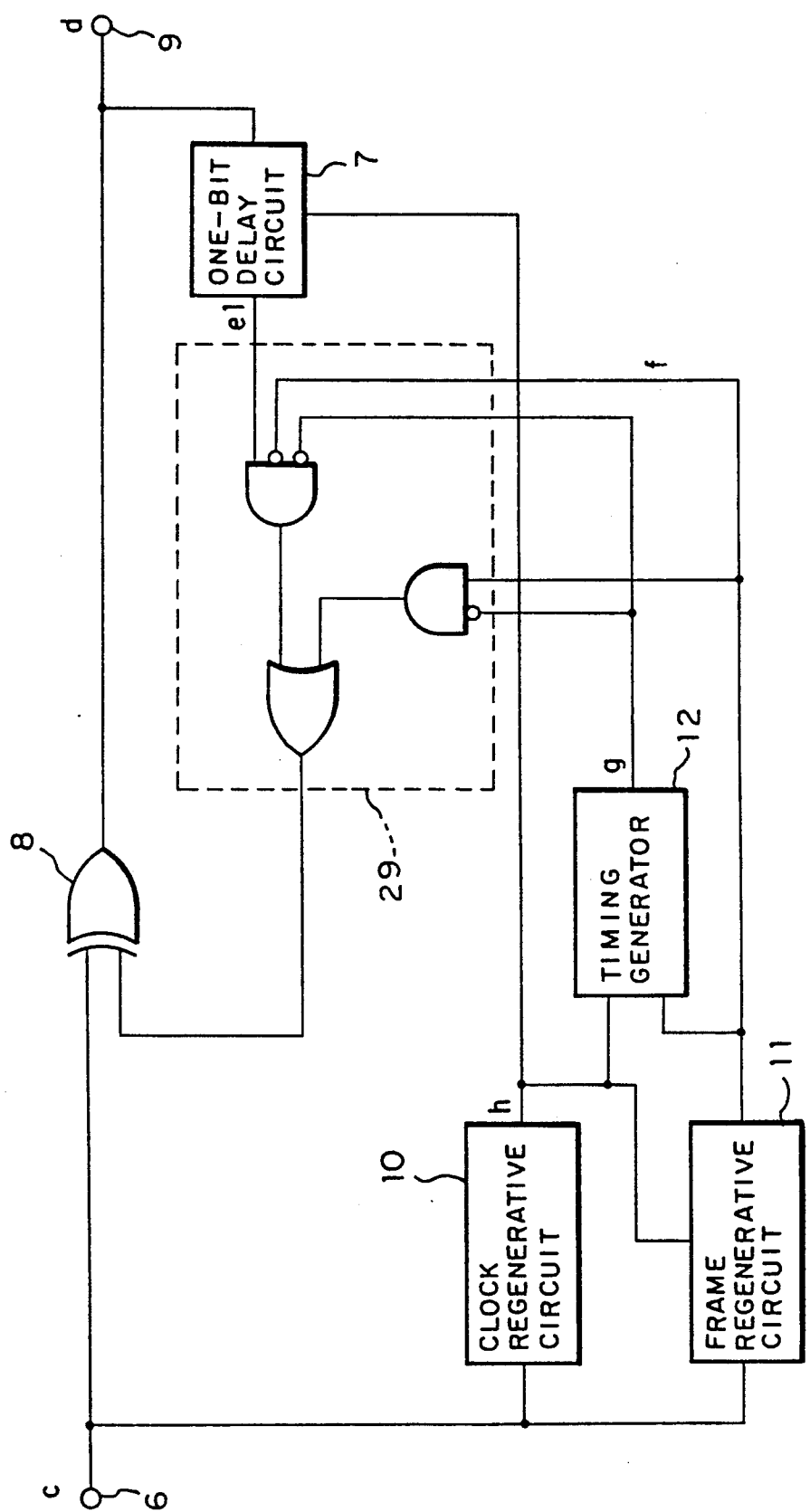
FIG. 10 is a block diagram showing a decoding circuit as a fourth embodiment of the invention.

FIG. 10 is a block diagram of a decoding circuit as a fourth embodiment of the invention where the feedback data is determined by a logical circuit 29 in place of the set value and the data selector 13 of FIG. 9. The output signal of the logical circuit 29 is determined as shown in FIG. 11, and the decoding circuit performs operation in similar manner to the data selector 13 shown in FIG. 3 and the circuit using the set values e1-e3.

What is claimed is:

1. A decoding circuit for decoding a received digital data signal encoded by differential encoding and including frame synchronization bits, in which known data has been inserted into said signal at a predetermined data position at a transmission source, comprising:
   decoding means for decoding successive bits of said received signal in conjunction with previously decoded bits of said received signal;
   detecting means for detecting a timing of said predetermined data position in said received data signal; and
   means for setting previously decided bits used by said decoding means to said known data at a detected timing of said predetermined data position by said detecting means.

2. A decoding circuit as set forth in claim 1, wherein said detecting means comprises:
   a clock recovery circuit for regenerating a synchronized clock signal from said received signal;
   sampling means for sampling said received signal according to said clock signal;
   a frame recovery circuit for comparing the sampled received signal with a reference pattern corresponding to said frame synchronization bits, and for outputting a frame synchronization signal when both are coincident; and
   a timing generator for counting recovered clock signal pulses in response to said frame synchronization signal, and for outputting a timing signal indicating said predetermined data position of said received signal.

3. A decoding circuit as set forth in claim 2, wherein said timing generator comprises:
   a counter for counting said clock signal pulses; and
   a comparator for comparing an output value of said counter with reference data indicating the number of bits from a bit corresponding to said frame synchronization signal to a bit corresponding to said known data, and for generating said timing signal when said output value is coincident with said reference data.

4. A decoding circuit as set forth in claim 3, wherein said means for setting is a data selector which selects an initial value of a decoded data stream in response to said frame synchronization signal, selects data equal to said known data in response to said timing signal, and selects previously decoded bits as decoded by said decoding means in all other cases.

5. A decoding circuit as set forth in claim 4, wherein said comparator compares said output value of said counter with a plurality of reference data values and generates a plurality of timing signals during a single frame of received data; and
   said data selector selects known data from among a plurality of known data, respectively corresponding to said plurality of timing signals.

6. A decoding circuit for decoding a received digital data signal encoded by differential encoding and including frame synchronization bits, in which known data has been inserted into said signal at a predetermined data position at a transmission source, comprising:
- a buffer circuit for temporarily storing said received digital data signal;
- decoding means for decoding a signal outputted by said buffer circuit in conjunction with previously decoded bits of said received signal;
- a synchronization detecting circuit for detecting said frame synchronization signals and outputting a frame synchronization signal in response thereto, and detecting a timing of said known data and outputting a timing signal in response thereto; and
- data setting means for setting previously decoded bits used to decode said received digital data signal to said known data in response to said frame synchronization signal and said timing signal.

7. A decoding circuit as set forth in claim 6, wherein said synchronization detecting circuit comprises:
- a high speed clock generator for generating a high speed clock signal having a frequency higher than a bit rate of said received signal;
- a frame recovery circuit for comparing a received signal which has been sampled according to said high speed clock signal with a reference pattern corresponding to said frame synchronization bits, and outputting said frame synchronization signal upon coincidence thereof; and
- a timing generator for generating said timing signal based upon said high speed clock signal and said frame synchronization signal.

8. A decoding circuit as set forth in claim 7, wherein said means for setting is a data selector which selects an initial value of a decoded data stream in response to said frame synchronization signal, selects data equal to said known data in response to said timing signal, and selects previously decoded bits as decoded by said decoding means in all other cases.

9. A decoding circuit as set forth in claim 8, wherein said buffer circuit comprises a shift register having a number of stages equal to a number of bits of said received signal sampled with said high speed clock from the beginning of a data frame until generation of said timing signal by said timing generator.

10. A method for inhibiting error propagation in a digital transmission system using differential encoding of digital data, comprising the steps of:
- inserting into a digital data signal to be encoded known data at a predetermined data position;
- transmitting said encoded digital data signal to a receiver;
- decoding successive bits of the received digital data signal at the receiver by using previously decoded bits of said received signal;
- detecting a timing of said predetermined data position; and
- setting previously decoded bits used in the decoding of said received signal to the known data at the detected timing of said predetermined data position.

* * * * *

UNITED STATES PATENT AND TRADEMARK OFFICE
CERTIFICATE OF CORRECTION

PATENT NO. : 5,265,105
DATED : November 23, 1993
INVENTOR(S) : Yasushi Iwane

It is certified that error appears in the above-indentified patent and that said Letters Patent is hereby corrected as shown below:

Column 1, line 37, "1" (second occurrence) should read --i--.

Signed and Sealed this

Thirty-first Day of May, 1994

Attest:

BRUCE LEHMAN

Attesting Officer     Commissioner of Patents and Trademarks